United States Patent
Huang et al.

(10) Patent No.: US 10,868,106 B2
(45) Date of Patent: *Dec. 15, 2020

(54) SEMICONDUCTOR STRUCTURE AND METHOD

(71) Applicant: Taiwan Semiconductor Manufacturing Company, Ltd., Hsinchu (TW)

(72) Inventors: Wei-Li Huang, Pingtung (TW); Chi-Cheng Chen, Tainan (TW); Hon-Lin Huang, Hsinchu (TW); Chien-Chih Chou, New Taipei (TW); Chin-Yu Ku, Hsinchu (TW); Chen-Shien Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,440

(22) Filed: May 13, 2019

(65) Prior Publication Data

US 2019/0267445 A1  Aug. 29, 2019

Related U.S. Application Data

(60) Continuation of application No. 16/139,682, filed on Sep. 24, 2018, now Pat. No. 10,290,697, which is a
(Continued)

(51) Int. Cl.
*H01L 49/02* (2006.01)
*H01L 21/3213* (2006.01)
(Continued)

(52) U.S. Cl.
CPC ......... *H01L 28/10* (2013.01); *H01F 27/2804* (2013.01); *H01F 41/041* (2013.01);
(Continued)

(58) Field of Classification Search
CPC .............. H01F 10/137; H01L 21/32134; H01L 2924/1206; H01L 23/5227; H01L 23/645; H01L 28/10
See application file for complete search history.

(56) References Cited

U.S. PATENT DOCUMENTS 7,224,254 B2  5/2007  Choi et al.
9,484,136 B2  11/2016  Morrissey et al.
(Continued)

FOREIGN PATENT DOCUMENTS

KR  100627115 B1  9/2006
KR  20140031130 A  3/2014

*Primary Examiner* — Mary A Wilczewski
*Assistant Examiner* — Tsz K Chiu
(74) *Attorney, Agent, or Firm* — Slater Matsil, LLP (57) ABSTRACT

A method of manufacturing a semiconductor device and the semiconductor device are provided in which a plurality of layers with cobalt-zirconium-tantalum are formed over a semiconductor substrate, the plurality of layers are patterned, and multiple dielectric layers and conductive materials are deposited over the CZT material. Another layer of CZT material encapsulates the conductive material.

20 Claims, 9 Drawing Sheets

Related U.S. Application Data division of application No. 15/582,963, filed on May 1, 2017, now Pat. No. 10,084,032.

(60) Provisional application No. 62/446,155, filed on Jan. 13, 2017.

(51) Int. Cl.
  *H01F 41/04* (2006.01)
  *H01F 27/28* (2006.01)
  *H01L 27/22* (2006.01)
  *H01L 23/522* (2006.01)
  *H01L 23/64* (2006.01)

(52) U.S. Cl.
  CPC .. *H01L 21/32134* (2013.01); *H01L 21/32138* (2013.01); *H01L 21/32139* (2013.01); *H01L 23/5227* (2013.01); *H01L 23/645* (2013.01); *H01L 27/222* (2013.01); *H01L 2924/1206* (2013.01)

(56) References Cited

U.S. PATENT DOCUMENTS

| | | | |
|---|---|---|---|
| 9,799,721 B2 | 10/2017 | Kuo et al. | |
| 10,461,145 B2* | 10/2019 | Su | H01L 28/10 |
| 10,475,877 B1* | 11/2019 | Hsu | H01L 24/06 |
| 10,483,249 B2* | 11/2019 | Gardner | H01L 21/50 |
| 10,535,635 B2* | 1/2020 | Chen | H01L 23/5227 |
| 10,720,487 B2* | 7/2020 | Ku | H01L 28/10 |
| 2005/0045931 A1 | 3/2005 | Min et al. | |
| 2007/0000861 A1 | 1/2007 | Kamata et al. | |
| 2007/0262402 A1 | 11/2007 | Park | |
| 2008/0003699 A1 | 1/2008 | Gardner et al. | |
| 2008/0003760 A1 | 1/2008 | Gardner et al. | |
| 2008/0245967 A1 | 10/2008 | van Asselt et al. | |
| 2012/0168910 A1 | 7/2012 | Jackrel et al. | |
| 2014/0071636 A1 | 3/2014 | Sturcken | |
| 2014/0120249 A1 | 5/2014 | Kimura et al. | |
| 2014/0167193 A1 | 6/2014 | Iuliano et al. | |
| 2016/0013262 A1 | 1/2016 | England et al. | |
| 2016/0307991 A1 | 10/2016 | Kuo et al. | |
| 2017/0229532 A1 | 8/2017 | Chen et al. | |
| 2018/0286582 A1* | 10/2018 | Deligianni | H01F 17/0006 |
| 2019/0027553 A1 | 1/2019 | Huang et al. | |

\* cited by examiner

SEMICONDUCTOR STRUCTURE AND METHOD

This application is a continuation of U.S. patent application Ser. No. 16/139,682, filed on Sep. 24, 2018, entitled "Semiconductor Structure and Method," which is a division of U.S. patent application Ser. No. 15/582,963, filed on May 1, 2017, entitled "Semiconductor Structure and Method," now U.S. Pat. No. 10,084,032, issued on Sep. 25, 2018, which claims the benefit of U.S. Provisional Application No. 62/446,155, filed on Jan. 13, 2017, entitled "Semiconductor Structure and Method," which applications are hereby incorporated herein by reference.

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. One such application of an inductor may be as a choke, in which an inductor is designed to have a high inductive reactance to, or block, signals with certain frequencies in an electrical circuit while allowing passage of other signals at different frequencies in the electrical circuit. A choke may be made, for example to block a radio frequency (RF), and may be called a RF choke, which is of use in radio communications. Another application of an inductor may be as a voltage regulator, in which an inductor is used in a voltage control circuit to reduce sudden changes in the power supply, thus providing a smooth voltage supply to electrical systems for improved system performance.

Traditionally, inductors are used as discrete components which are placed on a substrate such as a printed circuit board (PCB) and connected to other parts of the system, such as an integrated circuit (IC) chip, via contact pads and conductive traces. Discrete inductors are bulky, use larger footprints on the PCB, and consume lots of power. Due to the continued miniaturization of electric devices, it is desirable to integrate inductors into IC chips. Therefore, there is a need for manufacturing integrated inductors that provide the benefit of size, cost and power reduction without sacrificing the electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to cobalt-zirconium-tantalum (CZT) materials integrated as part of an inductor. Other embodiments using CZT materials, however, are fully intended to be included within the scope of the embodiments.

Figure 1A:
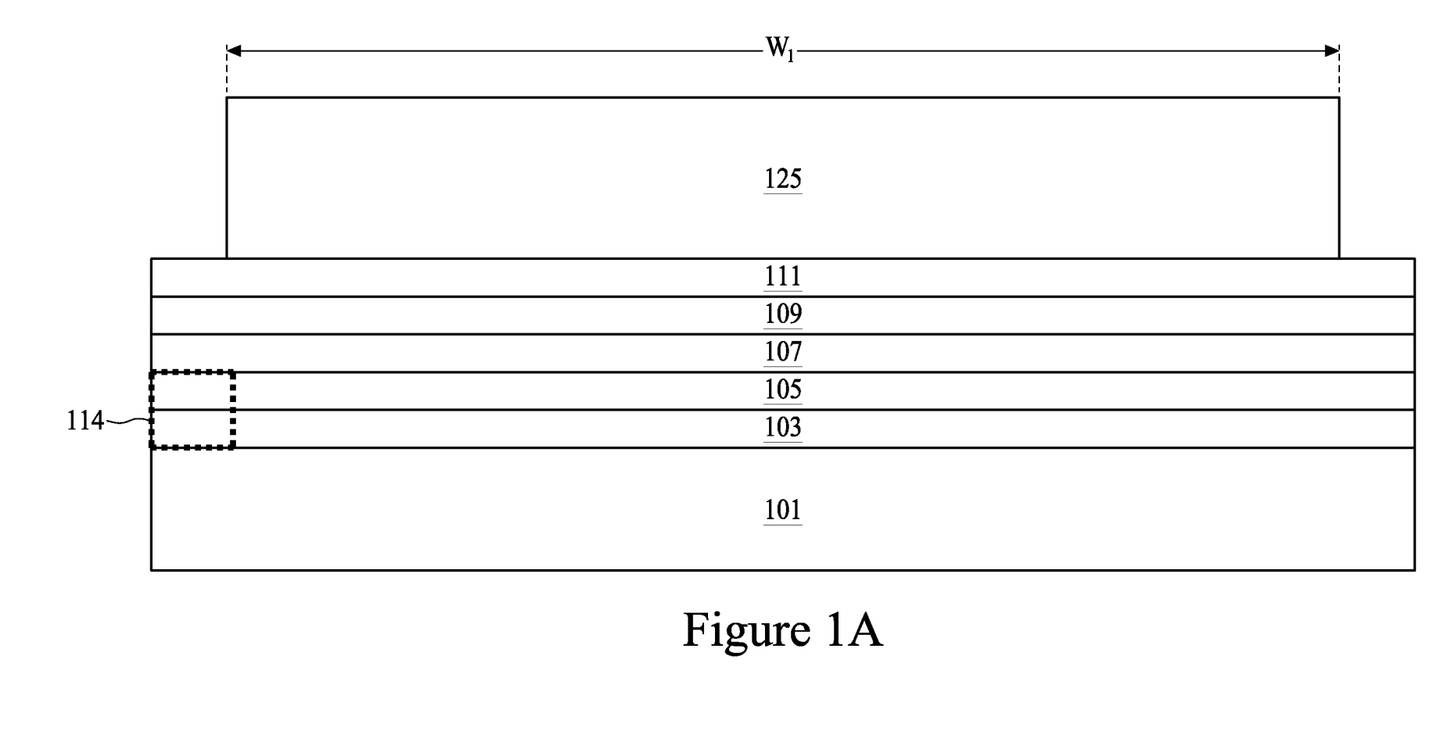
FIGS. 1A-1B illustrate CZT multilayers formed over a semiconductor substrate in accordance with some embodiments.

With reference now to FIG. 1A, a first CZT multilayer 103, a second CZT multilayer 105, a third CZT multilayer 107, a fourth CZT multilayer 109, and a fifth CZT multilayer 111 are formed on a semiconductor substrate 101. In an embodiment, the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Optionally, active devices (not separately illustrated) and passive devices may be formed within and/or on the semiconductor substrate 101. Such active devices may include transistors, capacitors, resistors, combinations or these, or the like. Any suitable devices may be included.

Figure 1B:
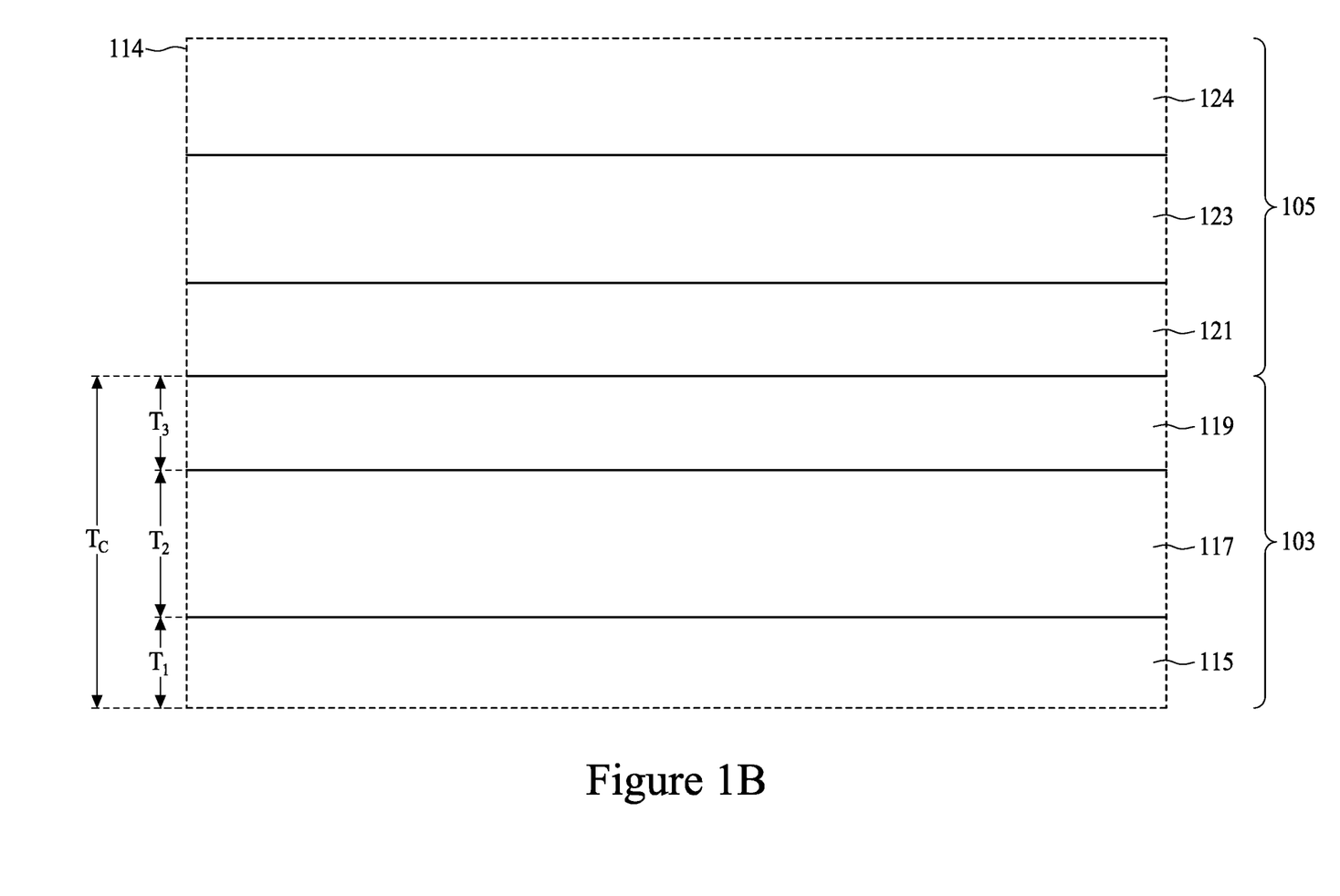

FIG. 1B illustrates a close-up view of the dashed box labeled 114 in FIG. 1A in which the first CZT multilayer 103 and the second CZT multilayer 105 are formed over the semiconductor substrate 101. In an embodiment the first CZT multilayer 103 is formed of a plurality of different layers, wherein at least one of the plurality of different layers is a first CZT layer 117. In a particular embodiment, the first CZT multilayer 103 comprises a first metal layer 115, the first CZT layer 117, and a first oxidized CZT (OCZT) layer 119. The first metal layer 115, in an embodiment, may be a metal such as tantalum, although any suitable metal may be utilized, and may be formed using a deposition process such as chemical vapor deposition, atomic layer deposition, physical vapor deposition, or any other suitable deposition process. Additionally, the first metal layer 115 may be formed to a first thickness $T_1$ of between about 10 Å and about 100 Å, such as about 50 Å, although any suitable thickness may be utilized.

The first CZT layer 117 is formed on the first metal layer 115 and comprises $Co_xZr_yTa_z$ (CZT), where x, y, and z represent the atomic percentage of cobalt (Co), zirconium (Zr), and tantalum (Ta), respectively. In some embodiments, x is in a range from about 0.85 to about 0.95, y is in a range from about 0.025 to about 0.075, and z is in a range from about 0.025 to about 0.075. In a particular embodiment, x=0.915, y=0.04, and z=0.045. In an embodiment the first CZT layer 117 may be formed using a deposition process such as chemical vapor deposition, atomic layer deposition, or physical vapor deposition, to a second thickness $T_2$ of between about 10 times and about 200 times the first thickness $T_1$ (of the first metal layer 115), such as between about 100 Å and about 20000 Å, such as about 5000 Å. However, any suitable thickness or deposition process may be utilized.

The first oxidized CZT layer 119 may be formed over the first CZT layer 117 and comprises $O_vCo_xZr_yTa_z$ (CZT), where v, x, y, and z represent the atomic percentage of oxygen (O), cobalt (Co), zirconium (Zr), and tantalum (Ta), respectively. In some embodiments, V is in a range from about 0.5 and about 0.65, x is in a range from about 0.85 to about 0.95, y is in a range from about 0.025 to about 0.075, and z is in a range from about 0.025 to about 0.075. In a particular embodiment, v=0.60, x=0.37, y=0.014, and z=0.016. In an embodiment the first oxidized CZT layer 119 may be formed using a deposition process such as chemical vapor deposition, atomic layer deposition, or physical vapor deposition, to a third thickness $T_3$ of between about 1 time and about 10 times the first thickness $T_1$ (of the first metal layer 115), such as between about 20 Å and about 500 Å, such as about 150 Å. However, any suitable thickness or deposition process may be utilized.

Once the first oxidized CZT layer 119 has been formed, the first CZT layer 117 may have a combined thickness between the first metal layer 115, the first CZT layer 117, and the first OCZT layer 119. In an embodiment the combined thickness $T_c$ is between about 0.1 μm and about 0.7 μm, such as about 0.5 μm. However, any suitable thickness may be utilized.

Additionally, by forming the first oxidized CZT layer 119 and the combined thickness $T_c$ has been met, a first cycle of forming the first CZT multilayer 103 has been created. Once the first CZT multilayer 103 has been formed, the second CZT multilayer 105 may be formed by repeating the processes used to form the first CZT multilayer 103. For example, in an embodiment the second CZT multilayer 105 may be formed by forming a second metal layer 121, a second CZT layer 123, and a second OCZT layer 124, wherein the second metal layer 121, the second CZT layer 123, and the second OCZT layer 124 are formed from similar materials, similar processes, and similar thicknesses as the first metal layer 115, the first CZT layer 117 and the first OCZT layer 119 in the first CZT multilayer 103. However, any suitable combination of materials, processes, and thicknesses may be utilized.

Returning now to FIG. 1A, the third CZT multilayer 107, the fourth CZT multilayer 109, and the fifth CZT multilayer 111 are formed over the second CZT multilayer 105 using a repetition of similar processes as those used for the first CZT multilayer 103 and the second CZT multilayer 105. However, while similar processes may be used, the materials, thicknesses and processes may also be different from layer to layer. Any suitable processes and parameters may be utilized.

Additionally, while only five CZT multilayers (the first CZT multilayer 103, the second CZT multilayer 105, the third CZT multilayer 107, the fourth CZT multilayer 109, and the fifth CZT multilayer 111) are illustrated in FIG. 1A, any suitable number of CZT multilayers may be utilized. For example, in a particular embodiment there may be between about 5 and about 50 CZT multilayers, such as between about 10 and 50 CZT multilayers, such as 23 CZT multilayers. As such, the total thickness of the CZT multilayers may be between about 2 μm and about 10 μm. However, any suitable number of CZT multilayers may be utilized.

FIG. 1A additionally illustrates a placement and patterning of a first masking layer 125 over the fifth CZT multilayer 111. In an embodiment the first masking layer 125 may be a photosensitive material placed onto the semiconductor substrate 101 using, e.g., a spin on process and then exposed to a patterned light source in order to induce a chemical reaction within the exposed portions of the photoresist. The photoresist may then be developed in order to remove either the exposed or unexposed portions of the photoresist. In another embodiment the first masking layer 125 may be a hard mask that has been patterned using a photoresist. Any suitable layer may be used to help a subsequent patterning of the first CZT multilayer 103, the second CZT multilayer 105, the third CZT multilayer 107, the fourth CZT multilayer 109, and the fifth CZT multilayer 111.

In an embodiment the first masking layer 125 is placed and patterned in order to form a mask to pattern the underlying layers (e.g., the first CZT multilayer 103, the second CZT multilayer 105, the third CZT multilayer 107, the fourth CZT multilayer 109, and the fifth CZT multilayer 111). Additionally, the first masking layer 125 may be patterned in such a way as to help shape the underlying CZT layers in a subsequent process. As such, in an embodiment the first masking layer 125 is patterned to have a first width $W_1$ of between about 100 μm and about 400 μm, such as about 295 μm. However, any suitable dimensions may be utilized.

Figure 2:
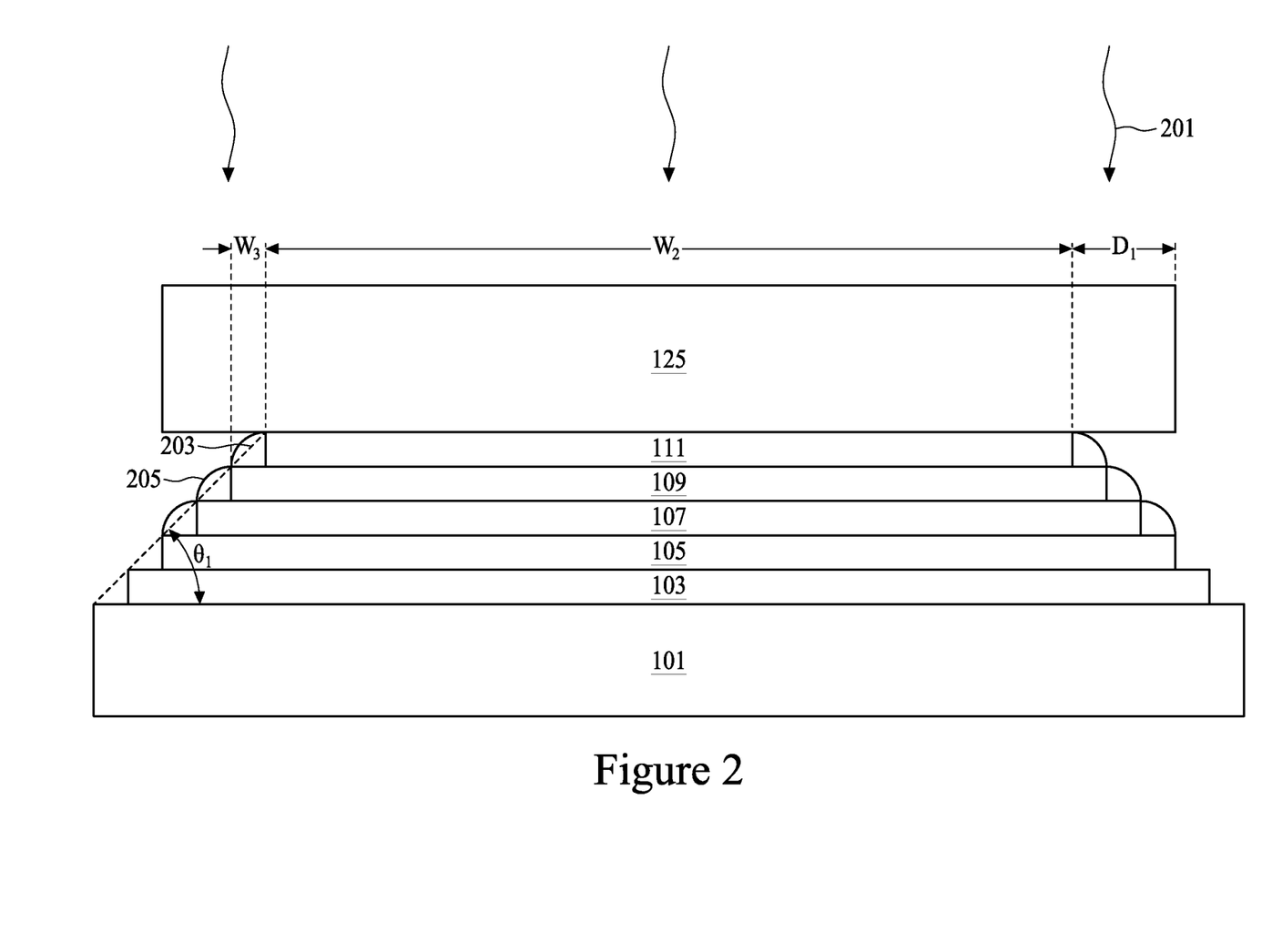
FIG. 2 illustrates a patterning of the CZT multilayers in accordance with some embodiments.

FIG. 2 illustrates that, once the first masking layer 125 has been patterned, the first CZT multilayer 103, the second CZT multilayer 105, the third CZT multilayer 107, the fourth CZT multilayer 109, and the fifth CZT multilayer 111 may be patterned with a first etching process (represented in FIG. 2 by wavy lines labeled 201) using the first masking layer 125 as a mask. In an embodiment the first etching process 201 is a wet etching process using etchants that are selective to the materials of the first CZT multilayer 103, the second CZT multilayer 105, the third CZT multilayer 107, the fourth CZT multilayer 109, and the fifth CZT multilayer 111.

For example, in an embodiment the first etching process 201 may use an etchant such as Hf combined with $HNO_3$, although any other suitable etchant, such as Hf or $HNO_3$ in an uncombined format, may alternatively be utilized. Additionally, in an embodiment in which the first etching process

201 is a wet etch, the first etching process 201 may be performed at a temperature of between about 20° C. and about 80° C., such as about 25° C. and for a time of between about 100 s and about 600 s, such as about 350 s. However, any suitable process parameters may be utilized.

Given the isotropic nature of the first etching process 201 in embodiments in which the first etching process 201 is a wet etching process, the individual CZT multilayers (e.g., the first CZT multilayer 103, the second CZT multilayer 105, the third CZT multilayer 107, the fourth CZT multilayer 109, and the fifth CZT multilayer 111) will be etched at different times as they are each exposed by the removal of an overlying layer. As such, the etching process will begin sooner for the CZT multilayers further away from the semiconductor substrate 101 (e.g., the fifth CZT multilayer 111), causing one or more of the CZT multilayers to undercut the first masking layer 125. For example, in an embodiment the CZT multilayer closest to the first masking layer 125 (e.g., the fifth CZT multilayer 111 when there are five multilayers) may undercut the first masking layer 125 by a first distance $D_1$ of between about 5 μm and about 50 μm, such as about 25 μm, causing the fifth CZT multilayer 111 to have a second width $W_2$ of between about 100 μm and about 400 μm, such as about 245 μm. However, any suitable distance may be utilized.

Additionally, the next CZT multilayer (e.g., the fourth CZT multilayer 109) may have a first portion 203 exposed by the overlying fifth CZT multilayer 111. In an embodiment the first portion 203 of the fourth CZT multilayer 109 may have a third width $W_3$ of between about 0.25 μm and about 2 μm, such as about 2 μm. However, any suitable dimensions may be utilized.

Such a structure with one CZT multilayer overlying some but not all of an underlying CZT multilayer and exposing a portion of the underlying CZT multilayer, may be repeated for each one of the CZT multilayers, causing a sidewall of the combined CZT multilayers to forms a stairstep pattern with a step height equal to the combined thickness $T_c$ of the individual CZT multilayers and a step width equal to the third width $W_3$. In a particular embodiment, the stair step pattern is formed with a first angle $\theta_1$ of between about 5 and about 70 degrees, such as about 15 degrees. However, any suitable dimensions may be used.

Additionally, while the first etching process 201 forms the stairstep pattern as described above, the first etching process 201 will also leave behind residue 205. In particular, this residue 205 may be left behind on the steps of the stairstep pattern and may comprise a material such as tantalum left over from the etching of the CZT material within the first CZT multilayer 103, the second CZT multilayer 105, the third CZT multilayer 107, the fourth CZT multilayer 109, and the fifth CZT multilayer 111.

Figure 3:
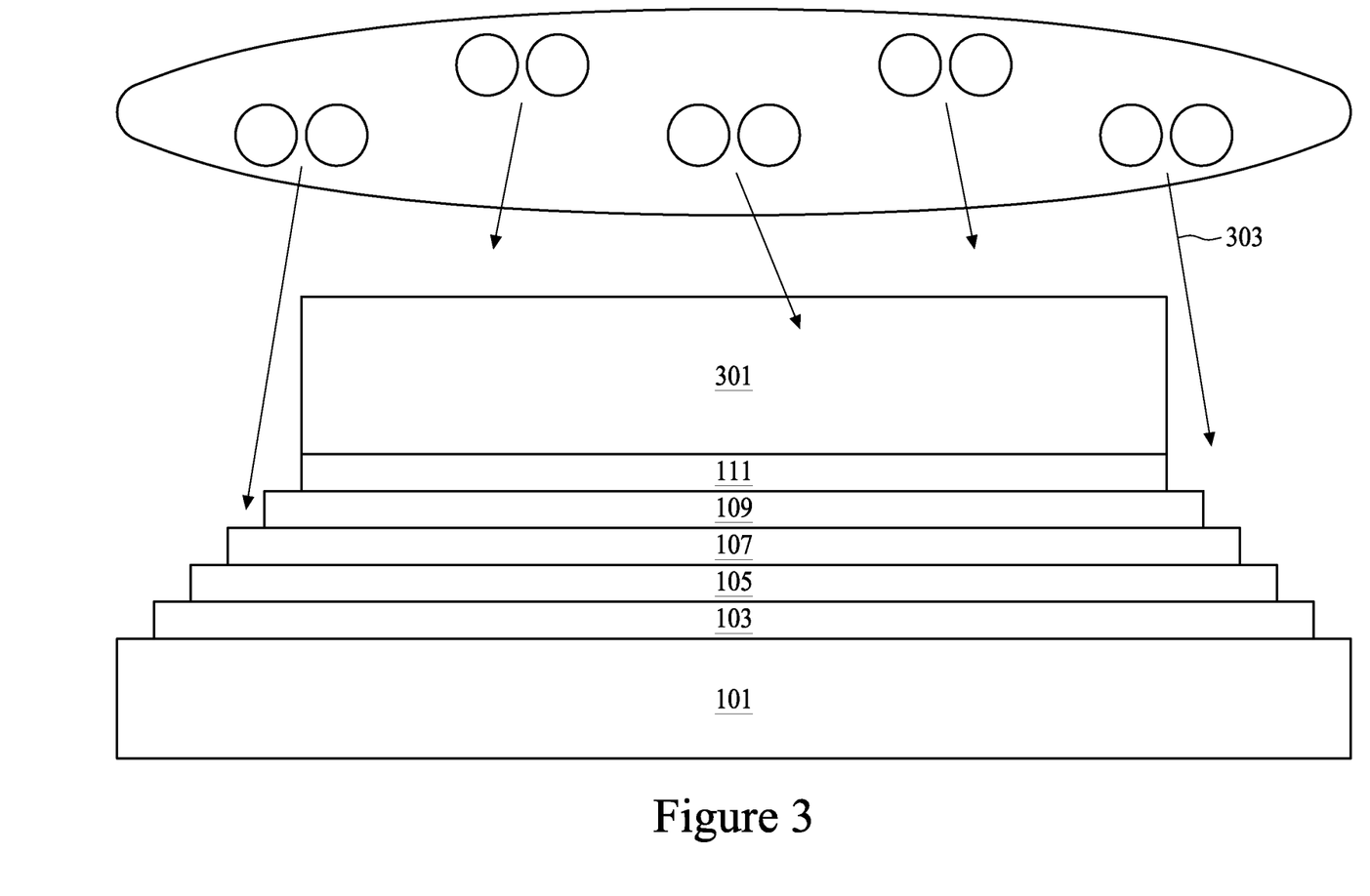
FIG. 3 illustrates a treatment in accordance with some embodiments.

FIG. 3 illustrates a removal of the first masking layer 125, a placement of a second masking layer 301, and a first treatment process (represented in FIG. 2 by the arrows labeled 303). In an embodiment in which the first masking layer 125 is a photoresist, the first masking layer 125 may be removed using an ashing process, whereby the temperature of the first masking layer 125 is increased until the photoresist experiences a thermal decomposition, whereby the remainder can thereafter be easily removed.

Once the first masking layer 125 has been removed, the second masking layer 301 may be applied in order to protect the top surface of the fifth CZT multilayer 111 during the first treatment process 303. In an embodiment the second masking layer 301 may be similar to the first masking layer 125, such as by being a photoresist material or a hard mask material. However, any suitable material may be utilized.

Additionally, once the material of the second masking layer 301 has been placed, the second masking layer 301 is patterned using, e.g., an exposing and development process. In an embodiment the second masking layer 301 is patterned to cover the top surface of the fifth CZT multilayer 111 and, as such, has a similar width as the fifth CZT multilayer 111 (e.g., the second width $W_2$). In another embodiment the second masking layer 301 has a smaller width than the fifth CZT multilayer 111.

Once the second masking layer 301 has been placed and patterned, the first treatment process 303 may be utilized in order to remove the tantalum residue 205 left over from the first etching process 201. If left in place, the tantalum residue 205 will interfere with subsequent deposition processes (such as a deposition of a first dielectric cap 401 discussed below with respect to FIG. 4). As such, the first treatment process 303 is utilized to remove the tantalum residue 205 so that it cannot interfere with the subsequent processing.

In an embodiment the first treatment process 303 is a plasma treatment process using a neutral plasma such as argon that will remove the tantalum residue 205 but will not undesirably react with the remaining structure. In an embodiment the first treatment process 303 may be performed with an argon plasma at a temperature of between about 50° C. and about 200° C., such as about 100° C. and at a pressure of between about 10 mTorr and about 100 mTorr, such as about 60 mTorr. Additionally, the first treatment process 303 may be performed for a time of between about 50 s and about 300 s, such as about 150 s, in order to help with the removal of the residue 205 although any suitable process parameters may be utilized.

Figure 4:
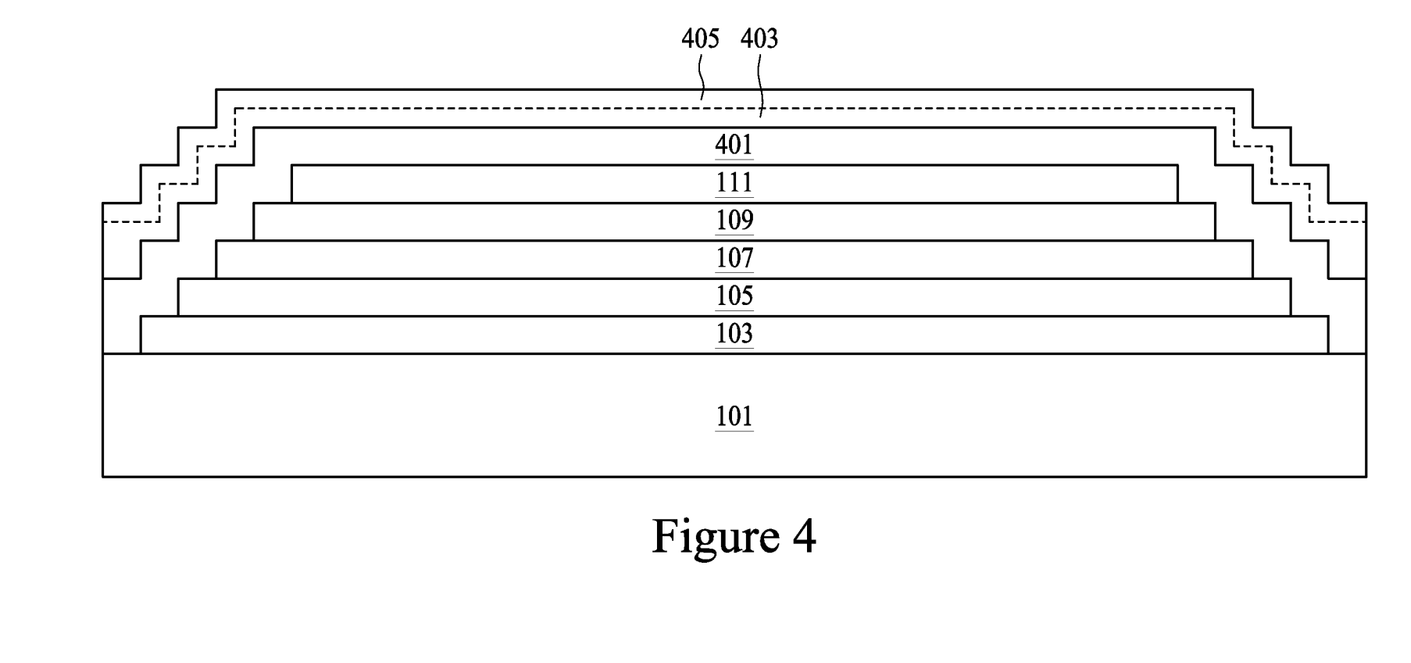
FIG. 4 illustrates formation of dielectric caps in accordance with some embodiments.

FIG. 4 illustrates a removal of the second masking layer 301 and a deposition of the first dielectric cap 401 and a second dielectric cap 403. In an embodiment in which the second masking layer 301 is a photoresist material, the second masking layer 301 may be removed using an ashing process as described above with respect to the removal of the first masking layer 125. However, any suitable removal process may be utilized.

Once the second masking layer 301 has been removed, the first dielectric cap 401 is deposited to cover the stack of CZT multilayers. In an embodiment the first dielectric cap 401 may be a dielectric material such as silicon oxide, although any suitable dielectric materials, such as silicon nitride, may be utilized. The first dielectric cap 401 may be formed using a deposition process such as chemical vapor deposition, atomic layer deposition, physical vapor deposition, or the like, to a thickness of between about 0.1 μm and about 2 μm, such as about 1 μm. However, any suitable process and thickness may be utilized.

By clearing the tantalum residue 205 from the stairstep structure of the CZT multilayers, the tantalum residue 205 is unable to interfere with the deposition process of the first dielectric cap 401. As such, the deposition of the first dielectric cap 401 (e.g., silicon nitride) may occur with a reduced number of voids, if any, leading to a reduced eddy current as well as an increased inductance level. Additionally, without the interference of the tantalum residue 205, the silicon nitride will have an increased adhesion, leading to a more structurally sound device.

After the first dielectric cap 401 has been formed, the second dielectric cap 403 may be formed over the first dielectric cap 401. In an embodiment the second dielectric cap 403 is a different dielectric material from the first dielectric cap 401. For example, in an embodiment in which the first dielectric cap 401 is silicon oxide, the second dielectric cap 403 is silicon nitride. In another embodiment in which the first dielectric cap 401 is silicon nitride, the second dielectric cap 403 may be silicon oxide. However, any other suitable dielectric may be utilized. The second dielectric cap 403 may be formed using a deposition process such as chemical vapor deposition, atomic layer deposition, physical vapor deposition, combinations of these, or the like. The second dielectric cap 403 may be formed to a thickness of between about 0.1 μm and about 2 μm, such as about 0.7 μm. However, any suitable deposition process and thickness may be utilized.

Optionally, a third dielectric cap (represented in FIG. 4 by the dashed line 405) may be formed over the second dielectric cap 403. In an embodiment the third dielectric cap 405 may be similar to the first dielectric cap 401, such as by being silicon nitride when the first dielectric cap 401 is silicon nitride or by being silicon oxide when the first dielectric cap 401 is silicon oxide. As such, the combination of the first dielectric cap 401, the second dielectric cap 403, and the third dielectric cap 405 form either an Nitride-Oxide-Nitride (NON) dielectric or an Oxide-Nitride-Oxide (ONO) dielectric.

Figure 5:
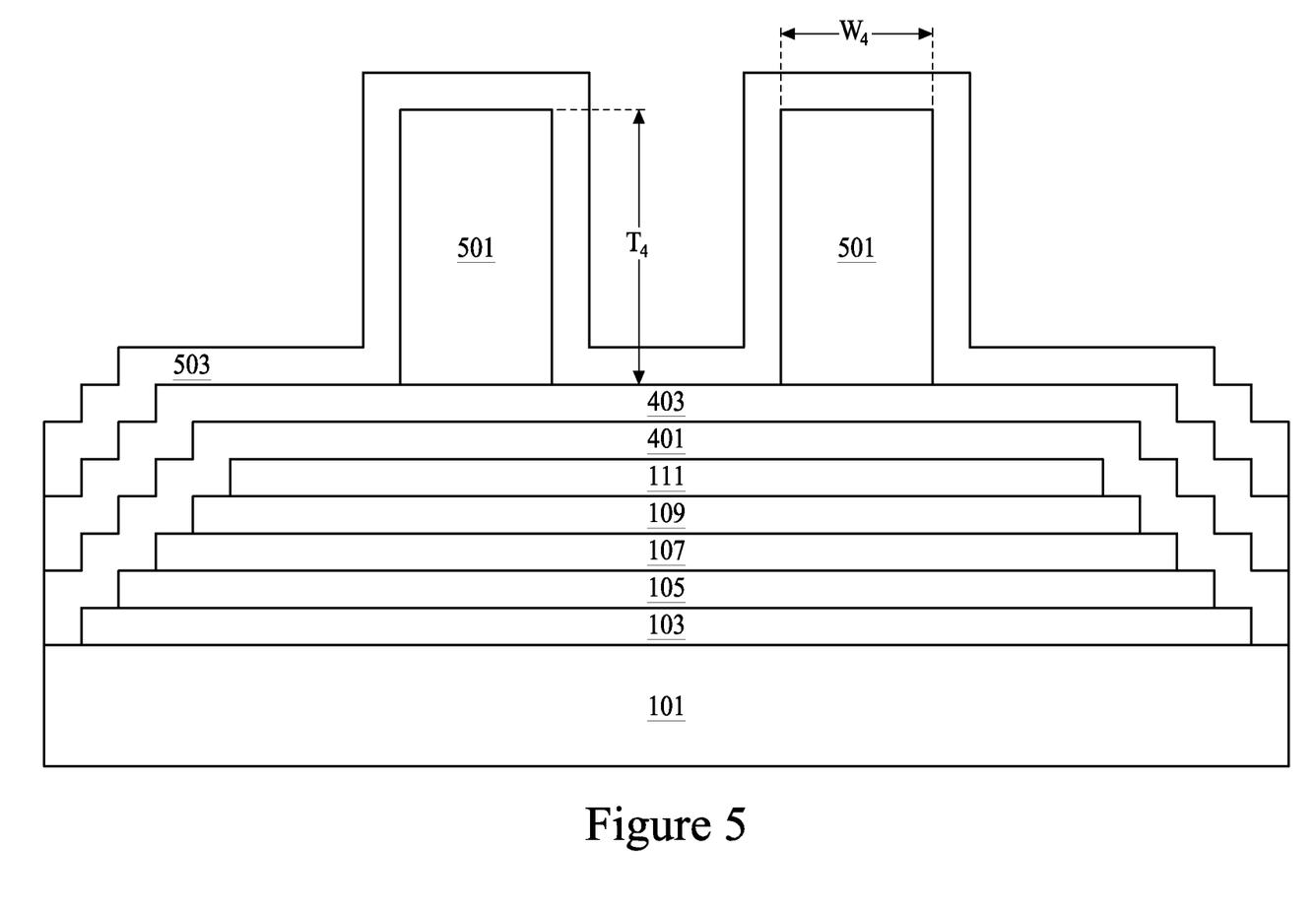
FIG. 5 illustrates formation of inductor coils in accordance with some embodiments.

FIG. 5 illustrates a formation of an inductor coil 501 over the dielectric caps. In an embodiment the inductor coil 501 may be part of a redistribution layer that connects the inductor to other portions of the semiconductor device (e.g., the active and passive devices or external connections). In an embodiment the inductor coil 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the inductor coil 501 is desired to be located.

Once the photoresist has been formed and patterned, a conductive material, such as copper, may be formed on the seed layer through a deposition process such as plating. However, while the material and methods discussed are suitable to form the conductive material, these materials are merely exemplary. Any other suitable materials, such as AlCu or Au, and any other suitable processes of formation, such as CVD or PVD, may alternatively be used to form the inductor coil 501.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

The inductor coil 501 may be formed to have a fourth width $W_4$ of between about 10 μm and about 300 μm, such as about 70 μm. Additionally, the inductor coil 501 may be formed to have a fourth thickness $T_4$ of between about 5 μm and about 20 μm, such as about 14 μm. Also, while only two individual coils of the inductor are illustrated in FIG. 5, any suitable number of coils may be present. However, any suitable dimensions may be utilized.

FIG. 5 also illustrates that once the inductor coil 501 has been formed, a fourth dielectric cap 503 can be formed over the inductor coil 501. In an embodiment the fourth dielectric cap 503 may be silicon nitride or silicon oxide, and can be either the same material or a different material from the first dielectric cap 401. As such, in embodiments in which the third dielectric cap 405 is not present, the first dielectric cap 401, the second dielectric cap 403 and the fourth dielectric cap 503 form a combined Oxide-Nitride-Oxide layer with the inductor coils 501 sandwiched between parts of the caps, or else may form an Oxide-Nitride-Oxide layer with the inductor coils 501 sandwiched between parts of the caps. The fourth dielectric cap 503 may be formed using a deposition process such as chemical vapor deposition, atomic layer deposition, physical vapor deposition, combinations of these, or the like, to a thickness of between about 0.1 μm and about 2 μm, such as about 1.1 μm. However, any suitable process or thicknesses may be utilized.

Figure 6A:
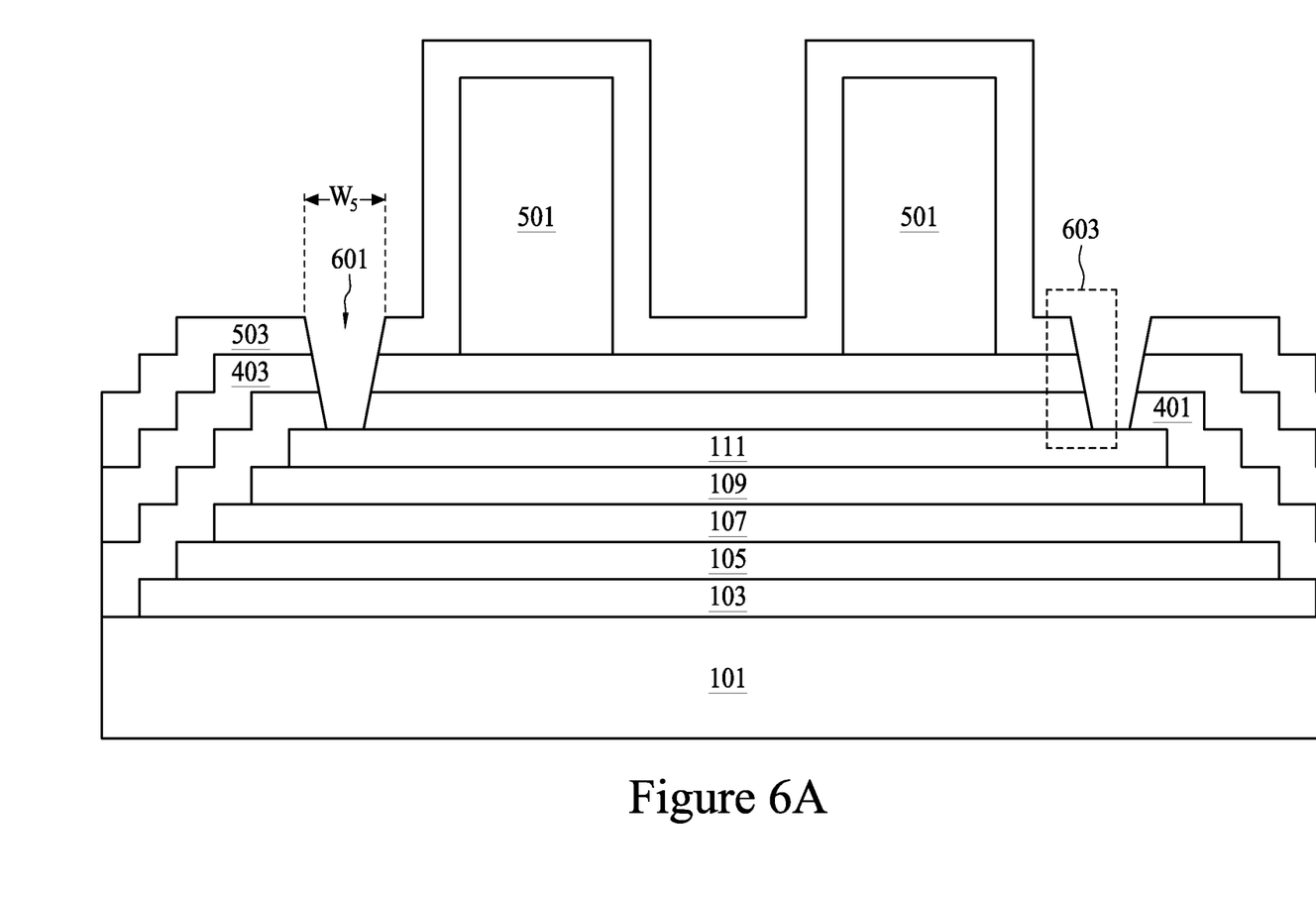
FIGS. 6A-6B illustrate formation of openings through dielectric caps in accordance with some embodiments.

FIG. 6A illustrates that, after the fourth dielectric cap 503 has been formed, first openings 601 are formed through the first dielectric cap 401, the second dielectric cap 403, the third dielectric cap 405 (if present), and the fourth dielectric cap 503 in order to expose the underlying CZT multilayers on either side of the inductor coil 501. In an embodiment the first openings 601 may be formed by placing, exposing, and developing a photoresist (not separately illustrated), and then utilizing the developed photoresist as a mask during an anisotropic etching process such as a reactive ion etch. However, any suitable process for forming the first openings 601 may be utilized. The first openings 601 may be formed to have a fifth width $W_5$ at a top of the first openings 601 of between about 10 μm and about 30 μm, such as about 20 μm, although any suitable dimensions may be utilized.

By using the multiple layers described herein, defects from the formation of the first openings 601 can be reduced or eliminated. In particular, pillar defects that can arise from residual silicon nitride during the etching process, can be eliminated or reduced by using the layers and etching processes described herein. As such, defects can be reduced and a more efficient device can be manufactured.

Figure 6B:
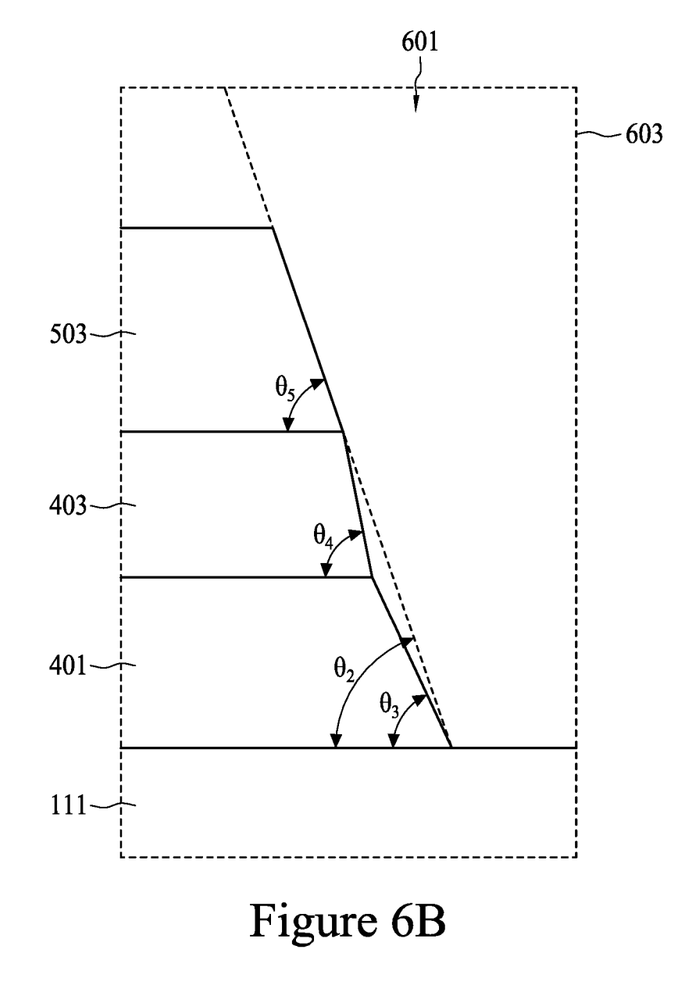

FIG. 6B illustrates a close up view of the dashed box labeled 603 in FIG. 6A and illustrates a resulting sidewall of the first dielectric cap 401, the second dielectric cap 403, and the fourth dielectric cap 503 (without the third dielectric cap 405). As can be seen, the differing etch selectivities between the different dielectric caps cause a difference in angles between the sidewalls of the first dielectric cap 401, the second dielectric cap 403, and the fourth dielectric cap 503. As such, while the first opening 601 may have an overall sidewall with a second angle $\theta_2$ that has an average value of between about 30 degrees and about 65 degrees, such as about 51.6 or 52 degrees the individual layers may have different angles from each other.

For example, the first dielectric cap 401 may have a third angle $\theta_3$ of between about 10° and about 60°, such as about 40°. Additionally, the second dielectric cap 403 may have a fourth angle $\theta_4$ of between about 20° and about 70°, such as about 60°, while the fourth dielectric cap 503 may have a fifth angle $\theta_5$ of between about 10° and about 60°, such as about 40°. However, any suitable angles may be utilized. Given these differing angles, the second dielectric cap 403 causes the sidewall of the first opening 601 to have a kink profile with the different angles.

Figure 7:
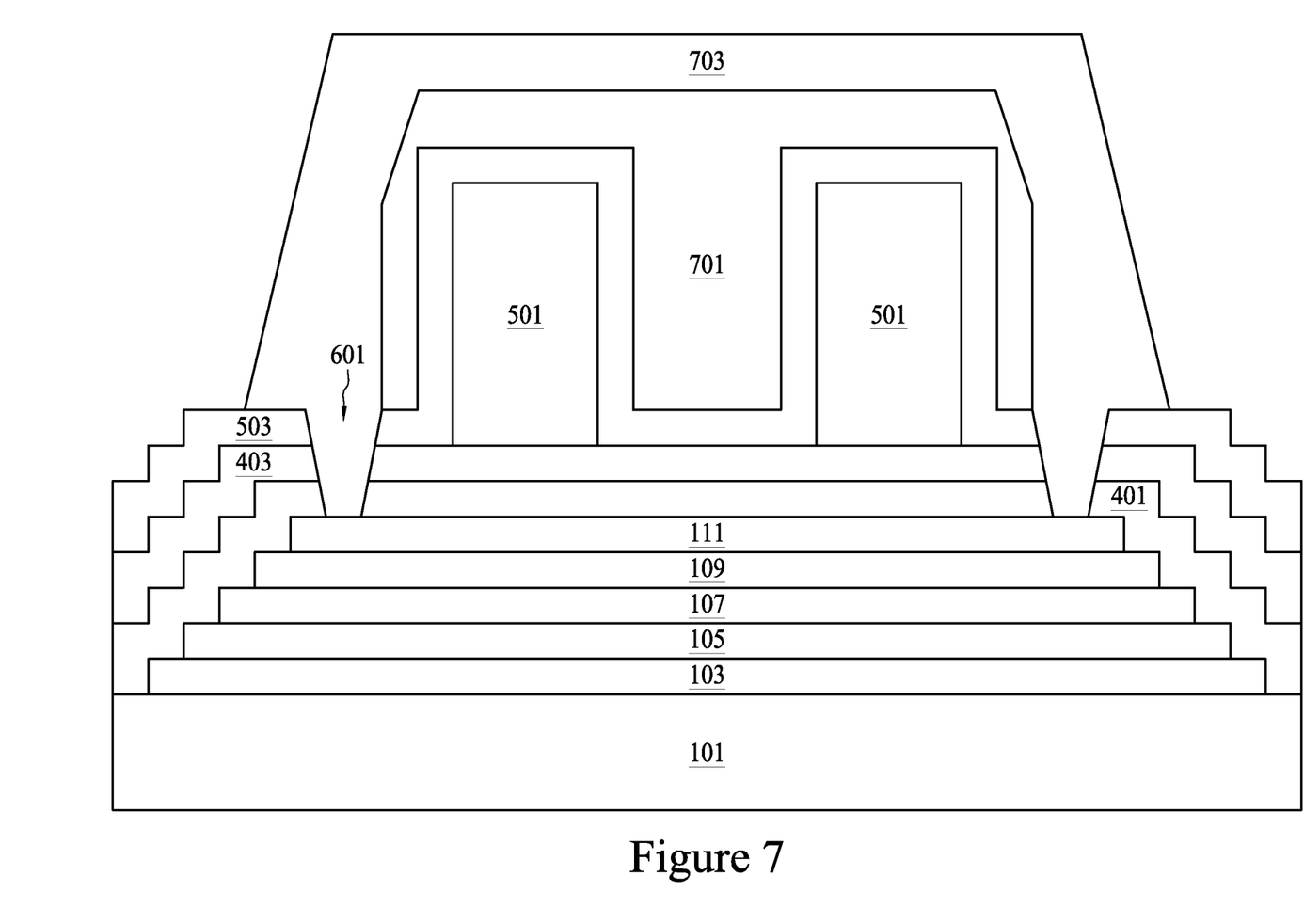
FIG. 7 illustrates formation of a CZT multilayer over the inductor coils in accordance with an embodiment.

FIG. 7 illustrates a formation of a dielectric dome 701 over the inductor coil 501. In an embodiment the dielectric dome 701 is a dielectric material such as polybenzoxaxole (PBO), although any suitable dielectric may be utilized. The dielectric dome 701 may be deposited using a process such as spin-on deposition to a thickness of between about 5 μm and about 25 μm, such as about 21 μm. Once the material of the dielectric dome 701 has been deposited, the material may be patterned into the dielectric dome 701 using, e.g., a masking and etching process, which also re-exposes the CZT multilayers through the first openings 601.

FIG. 7 additionally illustrates the formation of a sixth CZT multilayer 703 over the inductor coil 501 and through the first openings 601 in order to make contact with the fifth CZT multilayer 111. In an embodiment the sixth CZT multilayer 703 may be similar to the first CZT multilayer 103, such as by being a multilayer comprising a sixth metal layer, a sixth CZT layer, and a sixth OCZT layer. In an embodiment, the sixth metal layer, the sixth CZT layer, and the sixth OCZT layer may be similar to the first metal layer 115, the first CZT layer 117, and the first OCZT layer 119, although they may also be different.

By lowering the pillar defects, the sixth CZT multilayer 703 will have an improved coverage rate as it is being deposited through the first opening 601. For example, using the processes described herein, the coverage rate of the sixth CZT multilayer 703 can be raised from 58% to greater than 75%, such as 76%, an increase of 18%. Additionally, the inductance (Lac) can be improved from 6.4 nH to 7.0 nH, an increase of 9%.

In accordance with an embodiment, a method of manufacturing a semiconductor device comprising forming a first cobalt-zirconium-tantalum (CZT) layer and a second CZT layer over a semiconductor substrate is provided. The first CZT layer comprises a first metal layer, a first CZT material, and a first oxidized CZT (OCZT) material. A mask is applied over the second CZT layer and the second CZT layer is wet etched to expose a portion of the first CZT layer. The exposed portion of the first CZT layer is treated. A first dielectric material is formed over the second CZT layer, and a first inductor coil is formed over the first dielectric material. A second dielectric material is formed over the first inductor coil, and a third CZT layer is formed through the second dielectric material and in contact with the second CZT layer.

In accordance with another embodiment, a method of manufacturing a semiconductor device comprising forming a plurality of cobalt-zirconium-tantalum (CZT) layers over a substrate, wherein each one of the plurality of CZT layers comprises: a metal layer, an oxidized CZT material layer, and a CZT material between the metal layer and the oxidized CZT material layer, is provided. The plurality of CZT layers are shaped into a stairstep pattern, and a first dielectric cap is deposited over the stairstep pattern. A second dielectric cap is deposited over the first dielectric cap. An inductor coil is formed over the second dielectric cap, and a third dielectric cap is deposited over the inductor coil. Openings are formed to expose the plurality of CZT layers and a capping CZT layer is deposited over the inductor coil and through the openings.

In accordance with yet another embodiment, a semiconductor device comprising a semiconductor substrate and a plurality of layers over the semiconductor substrate is provided. The plurality of layers has a stairstep sidewall and wherein each one of the plurality of layers comprises: a metal layer, a cobalt-zirconium-tantalum (CZT) material over the metal layer, and an oxidized CZT material over the CZT material. A plurality of dielectric layers are over the plurality of layers and an inductor coil is over the plurality of dielectric layers. A capping dielectric is over the inductor coil, and a second CZT material extends over the capping dielectric, through the plurality of dielectric layers, and in contact with at least one of the plurality of layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a plurality of CZT layers over a semiconductor substrate;
    exposing a top surface of each of the plurality of CZT layers using a wet etching process;
    forming an inductor coil over and electrically isolated from the CZT layers; and
    forming another CZT layer over and electrically isolated from the inductor coil but in electrical connection with the plurality of CZT layers.

2. The method of claim 1, wherein a width of the top surface of one of the plurality of CZT layers has a width of between about 0.25 µm and about 2 µm.

3. The method of claim 2, wherein the top surfaces of each of the plurality of CZT layers collectively form a stair step pattern.

4. The method of claim 3, wherein the stair step pattern is formed with a first angle of between about 5 degrees and 15 degrees.

5. The method of claim 1, wherein the exposing the top surface leaves a tantalum residue along sidewalls of each of the plurality of CZT layers.

6. The method of claim 5, further comprising removing the tantalum residue prior to the forming the inductor coil.

7. The method of claim 6, wherein the removing the tantalum residue comprises performing a plasma treatment process.

8. A method of manufacturing a semiconductor device, the method comprising:
    placing a masking layer over a stack of CZT layers over a semiconductor substrate;
    recessing two or more of the stack of CZT layers from a sidewall of the masking layer, wherein each of the two or more of the stack of CZT layers are recessed a different distance;
    removing residue after the recessing the two or more of the stack of CZT layers;
    plating an inductor coil over the stack of CZT layers;
    isolating the inductor coil with a dielectric material; and
    depositing a final CZT layer over the inductor coil and in contact with the stack of CZT layers.

9. The method of claim 8, wherein one of the two or more of the stack of CZT layers is recessed between about 5 µm and about 25 µm.

10. The method of claim 9, wherein the one of the two or more of the stack of CZT layers has a width of between about 100 µm and about 245 µm after the recessing the two or more of the stack of CZT layers.

11. The method of claim 8, wherein the residue comprises tantalum.

12. The method of claim 8, wherein the inductor coil has a width of between about 10 µm and about 300 µam.

13. The method of claim 12, wherein the inductor coil has a thickness of between 5 µm and about 14 µm.

14. The method of claim 8, wherein a portion of the final CZT layer has a width through the dielectric material of between about 10 µm and about 30 µm.

15. A method of manufacturing a semiconductor device, the method comprising:
- etching a first opening and a second opening through a dielectric layer to expose a first CZT layer, the first CZT layer being one of a plurality of CZT layers, each one of the plurality of CZT layers having a different width;
- depositing a capping layer over an inductor coil, the inductor coil being located over the dielectric layer; and
- after the depositing the capping layer, filling the first opening and the second opening with a second CZT layer.

16. The method of claim 15, wherein the second CZT layer has a coverage rate of greater than about 75%.

17. The method of claim 15, wherein the second CZT layer has a second average angle of between about 30 degrees and about 65 degrees as the second CZT layer extends at least partially through the capping layer.

18. The method of claim 15, wherein the etching the first opening etches through a second dielectric layer, a third dielectric layer, and a fourth dielectric layer.

19. The method of claim 18, wherein the second dielectric layer is an oxide, the third dielectric layer is a nitride, and the fourth dielectric layer is an oxide.

20. The method of claim 18, wherein the second dielectric layer is a nitride, the third dielectric layer is an oxide, and the fourth dielectric layer is a nitride.

* * * * *